United States Patent [19]

Uenosono et al.

[11] 4,350,947
[45] Sep. 21, 1982

[54] SYSTEM FOR PREDICTING DESYNCHRONIZATION OF A SYNCHRONOUS MACHINE

[75] Inventors: Chikasa Uenosono; Takao Okada; Junya Matsuki, all of Kyoto; Tadashi Naito; Shinichiro Inoue, both of Kawasaki, all of Japan; Masaki Takahashi, No. 1-13-18, Higashi-Toyonaka, Toyonaka-shi, Osaka-fu, Japan

[73] Assignees: Fuji Electric Co. Ltd., Kanagawa; Masaki Takahashi, Toyonala, both of Japan

[21] Appl. No.: 123,964

[22] Filed: Feb. 25, 1980

[51] Int. Cl.³ .................. H02P 9/14; G01R 33/02
[52] U.S. Cl. ........................... 322/17; 307/87; 322/19; 322/22; 322/99
[58] Field of Search ............. 322/7, 8, 17, 18, 19, 322/20, 22, 23, 37, 100, 99; 324/158 MG; 307/309, 87; 328/1, 133; 361/20, 21, 23

[56] References Cited

U.S. PATENT DOCUMENTS 3,855,519 12/1974 Waldman .................. 322/20
3,855,529 12/1974 Langweiler ............ 324/158 MG
3,936,722 2/1976 Goto et al. ................ 322/20

OTHER PUBLICATIONS

*Handbook of Protective Relays,* Fukuda, Ohm Co. Ltd., Oct. 31, 1967, pp. 181, 182.
*Fuji Electric Journal,* vol. 39, No. 2, pub. Feb. 10, 1966, pp. 147, 148.

*Primary Examiner*—Robert J. Hickey

[57] ABSTRACT

Desynchronization of a synchronous machine is predicted by detecting a phenomenon of radical variation of the magnetic flux in the gap of a synchronous machine immediately before falling into an asynchronous state. For example, each functional value of the direct axis flux and the quadrature axis flux in the gap is detected for comparing the variation of each functional value with a predetermined reference level to predict desynchronization of the synchronous machine.

8 Claims, 4 Drawing Figures

Asynchronous Region

Shifting Point into Desynchronization

SYSTEM FOR PREDICTING DESYNCHRONIZATION OF A SYNCHRONOUS MACHINE

BACKGROUND OF THE INVENTION

The invention relates to a system for predicting desynchronization of the synchronous machine, wherein desynchronization is predicted by detecting a dangerous state of the synchronous machine which is apt to move into an asynchronous state.

When the synchronous machine connected to an electric power system falls into an asynchronous (step out) state, the whole system is liable to fall into an asynchronous state. Accordingly, when the synchronous machine is subjected to a dangerous desynchronization, some convenient arrangements such as a field control or a separation of the synchronous machine from the system are required to prevent the system from falling into an asynchronous state.

Hitherto, there is known a desynchronization detecting system for the synchronous machine which comprises a combination of power relays and impedance relays as shown in FIG. 1 which is so arranged that when a resistance component R is represented by the abscissas and a reactance component X is represented by the ordinates, a power relay $W_1$ operates in the region as hatched in FIG. 1 with a boundary of the straight line which is parallel with an axis of the abscissas and passes on the predetermined point "a" on a R-axis, a power relay $W_2$ operates in the region as hatched in FIG. 1 with the boundary of the straight line which is parallel with the axis of abscissas and passes on the predetermined point "-a" on the R-axis and an impedance relay Z operates in the region interior of a circle with a radius of a predetermined impedance Z ($=\sqrt{r^2+x^2}$, wherein r is a resistance and x is a reactance). When the synchronous machine moves into an asynchronous state so that an equivalent impedance viewed from an installation point of the relays shifts tracing the locus of a curve "Z" from the point $Z_O$ of the normal operation, the related operations of the power relays $W_1$, $W_2$ and the impedance relay Z commence to operate a desynchronization detecting sequency circuit (not shown) for detection of the desynchronous state.

The conventional system, however, detects the desynchronization only after the desynchronization of the synchronous machine and has no function to predict desynchronization when the machine resides in the dangerous state of desynchronization.

Another conventional system with a function of predicting desynchronization is a desynchronization predicting system comprising stability limit control relays. This conventional system when applied, for example, to a synchronous generator includes a stability limit control relay "G" which actuates in the hatched region with the boundary of the curve "g" as shown in FIG. 2 wherein an axis of abscissas represents an active power P, an axis of ordinates represents a reactive power Q, a curve L represents an output limit curve of the synchronous generator and a curve "m" represents a steady-state stability limit curve and when the vector coordinates W($=P+jQ$) of an output of the synchronous generator shifts tracing a locus of the curve "s" from the normal operation point $W_O$ over the stability limit curve "g" into the asynchronous region 1. The stability limit control relay G works to increase an excitation of the synchronous generator so as to withdraw the output vector coordinates W to the normal position for prevention of the machine from shifting into the asynchronous state.

However, either the desynchronization predicting system with the stability limit control relay or the desynchronization detecting system with the power relays and the impedance relays in combination utilizes as an input for detection, the external electric values such as a voltage across terminals, an output current, an impedance, an output, a reactive power, a phase angle and the like of the synchronous machine but is not responsive to an abnormal condition of the physical values in the synchronous machine so that it is doubtful whether the detected results represent the real position of the synchronous machine.

SUMMARY OF THE INVENTION

The inventors have discovered after various consideration and research the fact that immediately before shifting into desynchronization of the synchronous machine, as shown in FIG. 3, the direct axis flux $\phi_d$ and the quadrature axis flux $\phi_q$ in the gap are varied radically so that desynchronization may be predicted by detecting the functional values of the direct and quadrature axis flux.

Accordingly, a general object of the invention is to provide a system for predicting desynchronization of the synchronous machine which may positively predict a dangerous state where the synchronous machine is shifting into desynchronization.

A principal object of the invention is to provide a system for predicting desynchronization of the synchronous machine, characterized by detecting the functional values of the direct and quadrature axis flux in the gap of the synchronous machine.

Another object of the invention is to provide a system for predicting desynchronization of the synchronous machine in which an increment of the ratio $\phi_q/\phi_d$ of the quadrature axis flux $\phi_q$ and the direct axis flux $\phi_d$ over a predetermined reference level is detected to predict the desynchronization of the synchronous machine.

In another way, the desynchronization of the synchronous machine may be predicted by detecting a decrement of the product $\phi_d \times \phi_q$ of the direct axis flux $\phi_d$ and the quadrature axis flux $\phi_q$ below a predetermined reference level.

Further, the desynchronization of the synchronous machine may be predicted by detecting a decrement of the direct or quadrature axis flux $\phi_d$ or $\phi_q$ below a predtermined reference level.

Alternatively, the desynchronization of the synchronous machine may be predicted by detecting an increment of the decreasing rate ($-d\phi_d/dt$) of the direct axis flux $\phi_d$ or the decreasing rate ($-d\phi_q/dt$) of the quadrature axis flux over a predetermined reference level.

Still in another way, the desynchronization of the synchronous machine may be predicted by detecting a decreasing inclination of the absolute values of the direct axis flux $\phi_d$ and the quadrature axis flux $\phi_q$.

Other objects and advantages of the invention will be further understood by reference to the examples given below and to the drawings, all of which are given for illustrative purpose only and are not limitative, the drawings being:

PREFERRED EMBODIMENTS OF THE INVENTION

Figure 4:
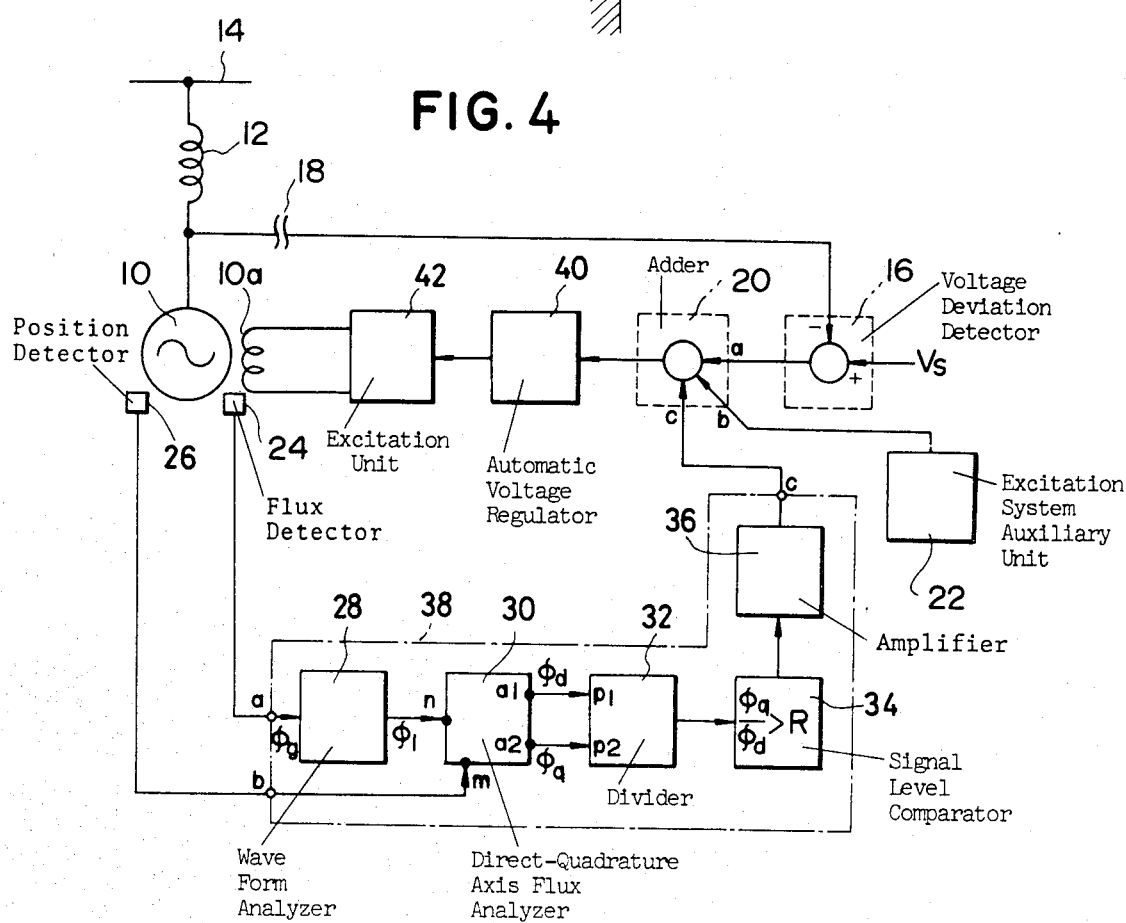
FIG. 4 is a block diagram illustrative of the synchronous generator control circuit of an embodiment of the system for predicting desynchronization of the synchronous machine in accordance with the invention.

In FIG. 4, an armature terminal of a synchronous generator 10 is connected through an impedance 12 to a power system 14. The armature terminal of the synchronous generator 10 is further connected through a voltage transformer 18 to an input terminal of the voltage deviation detector 16 which is in turn connected to a reference voltage source $V_s$. An output terminal of the voltage deviation detector 16 is connected to an input terminal "a" of an adder 20. An input terminal "b" of the adder 20 is connected to an excitation system auxiliary unit 22 such as a vibration-suppressing-stabilizer.

A gap flux detector 24 and a direct—quadrature axis position detector 26 are arranged in the synchronous generator.

The output terminal of the gap flux detector 24 is connected via the input terminal "a" of the desynchronization predicting unit 38 including a wave form analyzer 28 which analyzes the fundamental harmonic and similar components of the flux in the gap, a direct—quadrature axis flux analyzer 30, a divider 32, a signal level comparator 34 and an amplifier 36, to the input terminal of the wave form analyzer 28. The output terminal of the direct-quadrature axis position detector 26 is connected via the input terminal "b" of the desynchronization predicting unit 38 to one input terminal "m" of the direct-quadrature axis flux analyzer 30 whereas the output terminal of the wave form analyzer 28 is connected to the other input terminal "n" of the direct-quadrature axis flux analyzer 30 and the direct axis flux output terminal "a", and the quadrature axis flux output terminal "a₂" of the direct-quadrature axis flux analyzer 30 are connected respectively to the input terminals "p₁" and "p₂" of the divider 32. An output terminal of the divider 32 is connected through a signal level comparator 34 and an amplifier 36 to an input terminal "c" of the adder 20 via the output terminal "c" of the desynchronization predicting unit 38.

An output terminal of the adder 20 is connected to an input terminal of an automatic voltage regulator 40 which at its output is in turn connected through an excitation unit 42 to a field winding 10a of the synchronous generator 10.

A typical operation of the system in accordance with the invention follows.

The generator terminal voltage generated by the synchronous generator 10 is supplied through the voltage transformer 18 to the voltage deviation detector 16 for comparison with the reference voltage $V_s$, then the deviation is fed into the input terminal "a" of the adder 20 whereas an output of the excitation system auxiliary unit 22 is fed into the input terminal "b" of the adder 20 for addition and an output of the adder 20 is supplied into the input terminal of the automatic voltage regulator 40. The automatic voltage regulator 40 supplies the output responding to the input to the excitation unit 42 for feeding to the field winding 10a of the synchronous generator 10 an excitation current by which the terminal voltage of the synchronous generator 10 is maintained in a predetermined voltage responding to the reference voltage $V_s$ so that the synchronous generator 10 generates the predetermined voltage for operation in synchronism with the power system 14.

The gap flux $\phi_g$ detected by the gap flux detector 24 is fed into the wave form analyzer 28, and then the fundamental harmonic component only is fed into one input terminal "n" of the direct-quadrature axis flux analyzer 30, and simultaneously the position of the armature relative to the direct and quadrature axis at each instant is detected by the direct-quadrature axis position detector 26 so that the position detecting signals are fed into the other input terminal "m" of the direct-quadrature axis flux analyzer 30.

On the direct-quadrature axis flux analyzer 30, the direct axis flux $\phi_d$ and the quadrature axis flux $\phi_q$ at each instant analyzed in accordance with the input supplied through the input terminals "m" and "n" are fed via the output terminals "a₁" and "a₂" to the input terminals "p₁" and "p₂" of the divider 32 to calculate the ratio $\phi_q/\phi_d$ of the quadrature axis flux $\phi_q$ and the direct axis flux $\phi_d$ and the resultant output is then fed into the input terminal of the signal level comparator 34.

Figure 1:
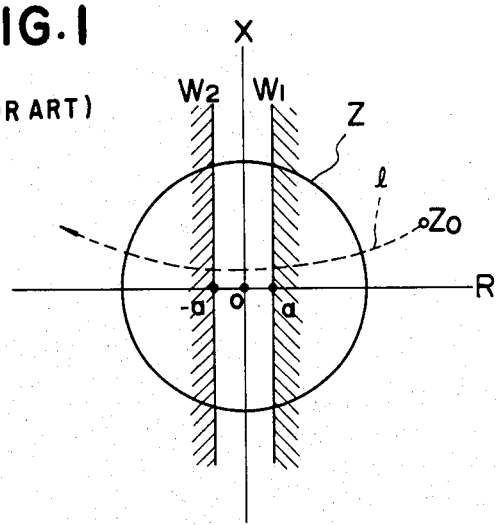
FIG. 1 is a pictorial diagram illustrative of the function of the conventional system for detecting desynchronization of the synchronous machine.
Figure 2:
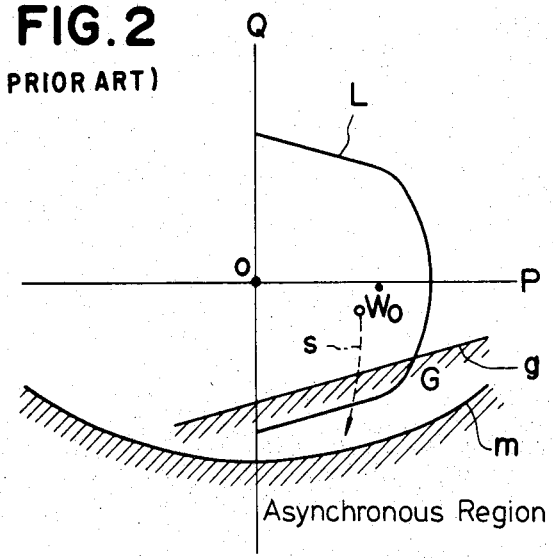
FIG. 2 is a pictorial diagram illustrative of the function of the conventional system for predicting desynchronization of the synchronous machine.
Figure 3:
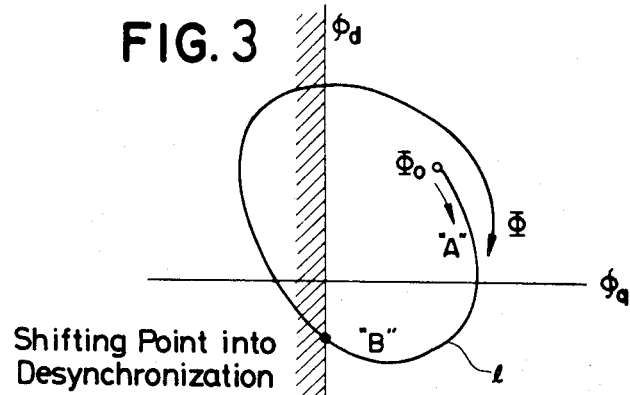
FIG. 3 is a graphical diagram showing the variation of the direct and quadrature axis flux in the gap before and after desynchronization of the synchronous machine.

The ratio $\phi_q/\phi_d$ of the quadrature axis flux $\phi_q$ and the direct axis flux $\phi_d$ increases, as will be obviously appreciated from FIG. 3, when the coordinate point $\Phi$ moves tracing a locus "Z" from the normal operation point $\Phi_0$ towards "A" portion. The signal level comparator 34 is arranged to generate no output when the input signal remains below a predetermined reference level R.

Accordingly, when the synchronous generator 10 is working in a normal condition or not under desynchronization, the signal level comparator 34 is kept with no output and thus no input is fed into the input terminal "c" of the adder 20 from the amplifier 36 so that the synchronous generator 10 is working without compensation operation of the excitating current.

Where the synchronous generator 10 falls into a condition of desynchronization by some causes so that the coordinate point $\Phi$ moves along the locus "Z" to "A" portion and thus the ratio $\phi_q/\phi_d$ of the quadrature axis flux $\phi_q$ and the direct axis flux $\phi_d$ increases over the reference level R, an output signal which is generated at the output terminal of the signal level comparator 34 to indicate a dangerous condition of desynchronization is amplified by the amplifier 36 to be fed via the output terminal of the desynchronization predicting unit 38 to the input terminal "C" of the adder 20. Accordingly, the output of the adder 20 is increased to render the automatic voltage regulator 40 to enforce the excitation of the field winding $10_a$ via the excitation unit 42 and thus the synchronous generator 10 is prevented from shifting into the asynchronous condition.

The desynchronization may also be predicted similarly as in the preceding embodiment by detecting the decrement of the product $\phi_d \times \phi_q$ over a predetermined reference level (cf. FIG. 3 "A") in lieu of detecting the ratio $\phi_q \times \phi_d$ of the quadrature axis flux $\phi_q$ and the direct axis flux $\phi_d$.

Further, the desynchronization may be predicted similarly as in the preceding embodiment by detecting the decrement of the direct axis flux $\phi_d$ below the predetermined reference level (cf. FIG. 3 "A") or the decrement of the quadrature axis flux $\phi_q$ below the predetermined reference level (cf. FIG. 3 "B").

Alternately, the desynchronization may be predicted similarly as in the preceding embodiment by detecting the increment of the decreasing rate $(-d\phi_d/dt)$ of the direct axis flux $\phi_d$ over a predetermined reference level (cf. FIG. 3 "A") or the increment of the decreasing rate $(-d\phi_q/dt)$ of the quadrature axis flux $\phi_q$ over a predetermined reference level (cf. FIG. 3 "B").

Further, the desynchronization may be detected similarly as in the preceding embodiment by detecting the decreasing inclination of the absolute values both of the direct axis flux $\phi_d$ and the quadrature axis flux $\phi_q$ (cf. FIG. 3 "B").

As distinctly understood, the system according to the invention may be applied to any synchronous machines such as the synchronous motor, the synchronous phase modifier and the like although the foregoing embodiments are conveniently directed to synchronous generators.

According to the invention, there is provided a system which may positively predict the dangerous condition of desynchronization of the synchronous machine with a remarkable effect to enhance the controlling performance of the synchronous machine.

Further, the system according to the invention may also be applied for measurement of the variation of the condition of the synchronous machine other than the desynchronization.

Although the invention has been described in connection with the preferred embodiments of the invention, various modifications may still be performed without departing from the scope of the claims.

What is claimed is:

1. A method for predicting desynchronization of a synchronous machine, comprising the steps of detecting at least one of (a) the functional values of the direct axis flux and (b) the quadrature axis flux in the gap of the synchronous machine, and determining the variance of said values from predetermined levels.

2. The method as claimed in claim 1, wherein desynchronization is predicted by detecting an increment of the ratio $\phi_q/\phi_d$ of the quadrature axis flux $\phi_q$ and the direct axis flux $\phi_d$ over a predetermined reference level.

3. The method as claimed in claim 1, wherein desynchronization is predicted by detecting a devrement of the product $\phi_d \times \phi_q$ of the direct axis flux $\phi_d$ and the quadrature axis flux $\phi_q$ below a predetermined reference level.

4. The method as claimed in claim 1, wherein desynchronization is predicted by detecting the decrement of the direct axis flux $\phi_d$ below a predetermined reference level.

5. The method as claimed in claim 1, wherein desynchronization is predicted by detecting a decrement of the quadrature axis flux $\phi_q$ below a predetermined reference level.

6. The method as claimed in claim 1, wherein desynchronization is predicted by detecting an increment of the decrease rate $(-d\phi_d/dt)$ of the direct axis flux $\phi_d$ over a predetermined reference level.

7. The method as claimed in claim 1, wherein desynchronization is predicted by detecting an increment of the decrease rate $(-d\phi_q/dt)$ of the quadrature axis flux $\phi_d$ over a predetermined reference level.

8. The method as claimed in claim 1, wherein desynchronization is predicted by detecting the decreasing inclination of the absolute values both of the direct axis flux $\phi_d$ and the quadrature axis flux $\phi_q$.

* * * * *